(12) United States Patent
Magoshi et al.

(10) Patent No.: US 6,835,942 B2
(45) Date of Patent: Dec. 28, 2004

(54) METHOD FOR CORRECTING A PROXIMITY EFFECT, AN EXPOSURE METHOD, A MANUFACTURING METHOD OF A SEMICONDUCTOR DEVICE AND A PROXIMITY CORRECTION MODULE

(75) Inventors: Shunko Magoshi, Kanagawa (JP); Shinji Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/602,670

(22) Filed: Jun. 25, 2003

(65) Prior Publication Data

US 2004/0075064 A1 Apr. 22, 2004

(30) Foreign Application Priority Data

Jun. 27, 2002 (JP) ........................................ 2002-188684

(51) Int. Cl.[7] .............................................. H01J 37/302
(52) U.S. Cl. ..................... 250/492.22; 430/296; 703/21; 716/21
(58) Field of Search .................... 250/492.22, 492.3; 403/296; 703/21; 716/21

(56) References Cited

U.S. PATENT DOCUMENTS

| | | | |
|---|---|---|---|
| 5,051,598 A | * | 9/1991 | Ashton et al. ............ 250/492.2 |
| 5,278,421 A | | 1/1994 | Yoda et al. ............ 250/492.22 |
| 6,243,487 B1 | | 6/2001 | Nakajima .................... 382/144 |
| 6,499,003 B2 | * | 12/2002 | Jones et al. ..................... 703/6 |

OTHER PUBLICATIONS

Murai et al., "Method for Fabrication of Patterns and Semiconductor Devices", Pub> No.: US 2003/0093767 A1, publication date: May 15, 2003.*

Fumio Murai et al., "Fast proximity effect correction method using a pattern area density map", J. Vac. Sci. Technol. B 10(6), Nov./Dec. 1992, pp. 3072–3076.

* cited by examiner

*Primary Examiner*—John R. Lee
*Assistant Examiner*—Zia R. Hashmi
(74) *Attorney, Agent, or Firm*—Finnegan, Henderson, Farabow, Garrett & Dunner, L.L.P.

(57) ABSTRACT

A method for correcting a proximity effect applied to a dose of an electron beam exposure, includes classifying an underlying pattern of a level underlying a thin film layer; dividing a processing pattern to be transferred on the thin film layer into a first pattern overlapping with the underlying pattern and a second pattern which does not overlap with the underlying pattern according to the classified underlying pattern; calculating a pattern area density for the first and second patterns in a unit region; and calculating a corrected dose for the processing pattern according to the pattern area density.

22 Claims, 9 Drawing Sheets

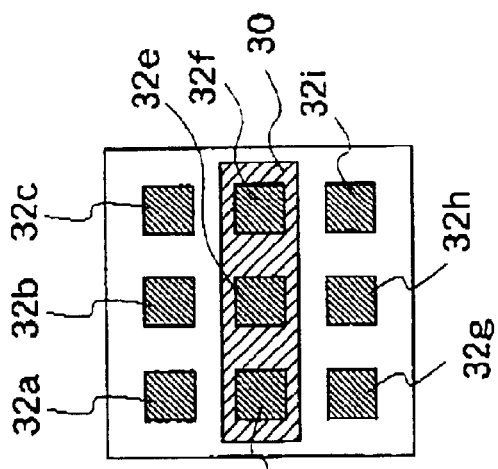
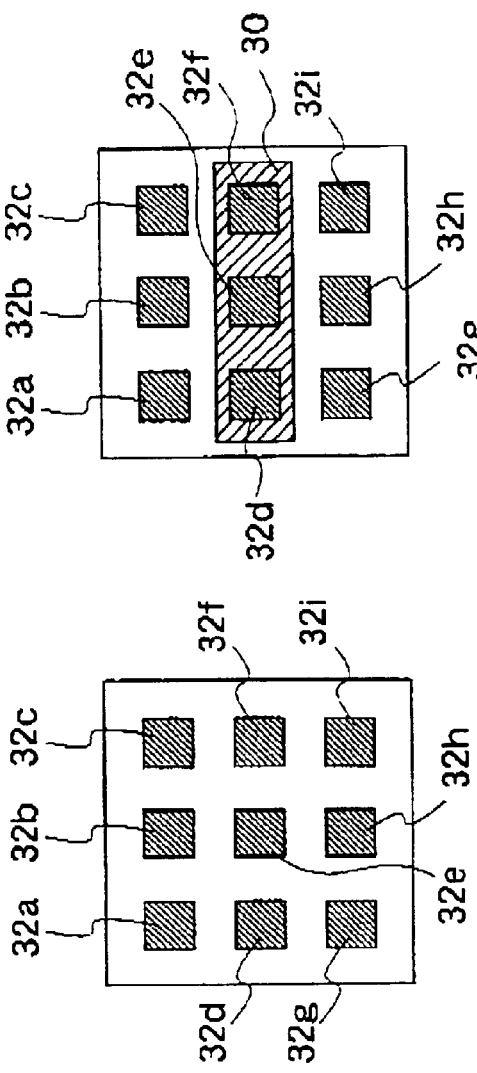
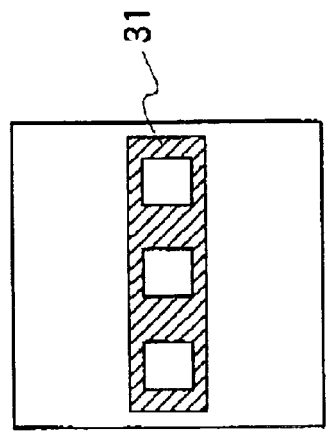
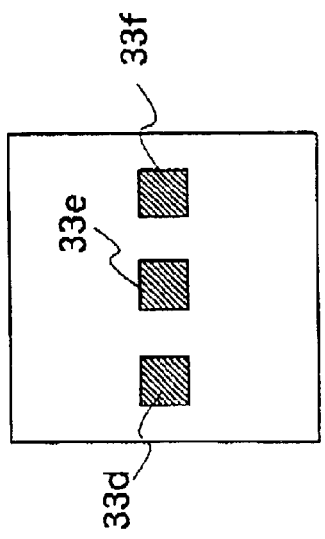
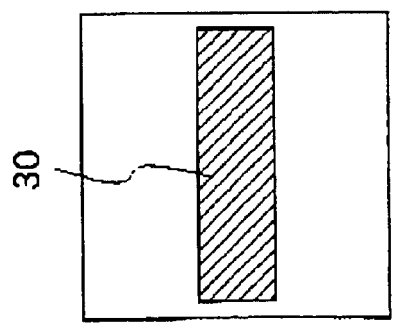

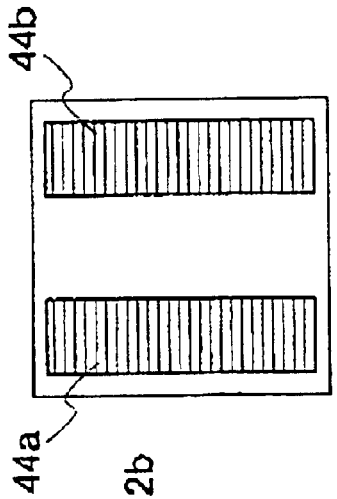
FIG. 16
FIG. 17
FIG. 18
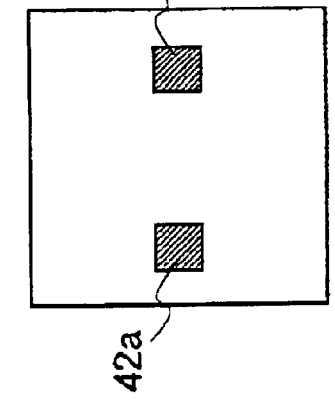
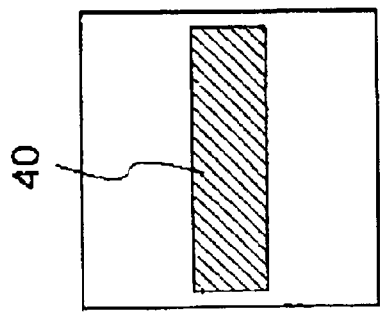
FIG. 19
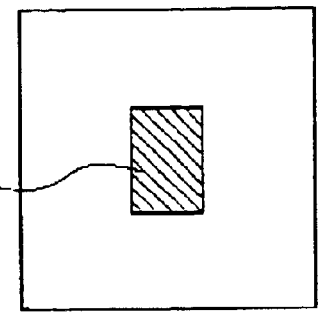
FIG. 22
FIG. 21
FIG. 20
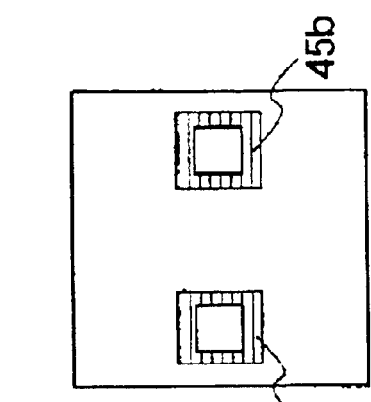
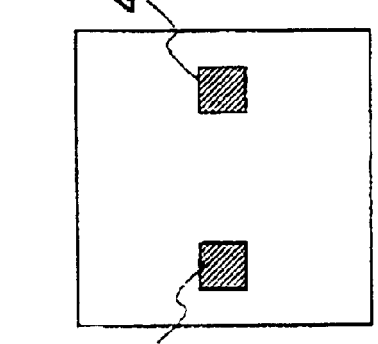
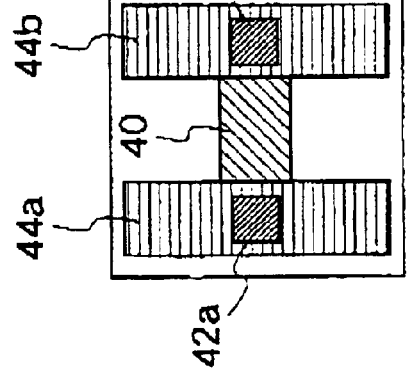

METHOD FOR CORRECTING A PROXIMITY EFFECT, AN EXPOSURE METHOD, A MANUFACTURING METHOD OF A SEMICONDUCTOR DEVICE AND A PROXIMITY CORRECTION MODULE

CROSS REFERENCE TO RELATED APPLICATIONS

This application is based upon and claims the benefit of priority from prior Japanese Patent Application P2002-188684 filed on Jun. 27, 2002; the entire contents of which are incorporated by reference herein.

BACKGROUND OF THE INVENTION

1. Field of the Invention

The present invention relates to an electron beam exposure method, more particularly to a method for correcting a proximity effect, an exposure method using the methodology for correcting a proximity effect, a manufacturing method of a semiconductor device and a proximity correction module.

2. Description of the Related Art

Photolithography has been widely used in manufacturing of a semiconductor device such as a large scale integrated circuit (LSI) because of its advantages such as process simplicity and low cost. Technological innovations in photolithography have been constantly carried out. In recent years, by shortening a wavelength of a light source such as an argon fluoride (ArF) excimer laser, miniaturization of an element to a level of 0.1 μm has been achieved. In an attempt to further advance the miniaturization, development of an exposure apparatus using a fluorine gas ($F_2$) excimer laser with a shorter wavelength has been undertaken. The exposure apparatus using a shorter wavelength is expected as a mass production lithography tool in response to a 70 nm rule generation. However, there are many problems to be solved in order to realize such exposure apparatus and the development period has been prolonged. Consequently, there is concern that the development of the exposure apparatus cannot catch up with the speed of the miniaturization of the semiconductor device.

As a countermeasure for the above problem, in the field of an lectron beam (EB) lithography, it is verified that processing as minute as 10 nm is possible by use of a narrow electron beam. From the viewpoint of miniaturization, there seems to be no problem at the moment. However, regarding a dimensional accuracy of a delineated pattern, there is a problem, a so-called "proximity effect," in which a finished size of the pattern varies depending on a pattern area density, When an electron beam is irradiated on a substrate for exposure, electrons expose a resist film while scattering inside the resist film. Thereafter, the electrons cause elastic scattering by colliding with a substrate material and are reflected. The reflection is called backward scattering and the reflected electrons are called backscattered electrons. The backscattered electrons expose the resist by being made incident on the resist again from the substrate. In this vent, a distribution of energies accumulated in the resist film is approximately expressed by the sum of Gaussian distributions as below.

$$f(r)=\{\exp(-r^2/\beta_f^2)/\beta_f^2+\eta^*\exp(-r^2/\beta_b^2)/\beta_b^2\}/(1+\eta) \quad (1)$$

Here, r is a distance from an electron beam irradiation position, $\beta_f$ is a forward scattering distance, $\beta_b$ is a backward scattering distance and $\eta$ is a ratio of a backscattered energy to an irradiation energy. The first term in the right side represents the forward scattered electrons and the second term in the right side represents a distribution of the backscattered electrons.

The problem here is the point that regions other than the position irradiated by the electron beam are subjected to exposure by the backscattered electrons. In other words, the resist film at the position irradiated by the electron beam is exposed not only by the incident electrons but also by the backscattered electrons in subjecting a surrounding pattern to the exposure. As a result, energies accumulated in the resist film are distributed depending on a surrounding pattern area density, thus causing a distribution in a finished size of a resist pattern after development. This is called the proximity effect.

A backscatter radius is at the same level as the backscattering distance $\beta_b$. When focusing attention on a small region narrower than this region, an accumulated energy $E_b$ in the resist due to backscattered electrons in the small region is approximately in proportion to a processing pattern area density α and is expressed as below.

$$E_b=C^*\eta^*\alpha^*D \quad (2)$$

Here, C is a constant and D is an irradiation energy (dose).

Therefore, by correcting the dose D in accordance with the processing pattern area density α, the size of the resist pattern can be controlled. The following equation is an example of a dose correction equation in the case of a uniform film structure of a substrate.

$$D=C/(\frac{1}{2}+\eta^*\alpha) \quad (3)$$

However, during the EB lithography in an actual LSI manufacturing process, there exists an underlying layer having a structure of an underlying pattern provided on a silicon (Si) substrate. Specifically, a material of the underlying pattern differs depending on a position of irradiating an electron beam and thus an energy intensity distribution of backscattered electrons changes depending on the material of the underlying pattern. Accordingly, it is necessary to correct an incident energy in consideration of the presence of not only a processing pattern but also the underlying pattern. Consequently, the earlier correction is performed by use of the following equation disclosed in "Journal of Vacuum Science Technology" (F. Murai, et al., J. Vac. Sci. Technol. B10, 3072, 1992).

$$D=C/\{\frac{1}{2}+\eta^*[\alpha+(\eta_1/\eta-1)^*\alpha^*\alpha_{10}]\} \quad (4)$$

Note that $\alpha_{10}$ is an underlying pattern area density of an underlying layer and $\eta_1$ is a ratio of a backscattered energy to an incident energy of an underlying pattern material.

However, the correction equation (4) hypothesizes that an area ratio of a pattern delineated on the underlying pattern among the delineating pattern region is equivalent to the underlying pattern area density $\alpha_{10}$ in a unit region. It is assumed that a processing pattern 30 of a pattern area density α as shown in FIG. 1 is exposed on a semiconductor substrate having an underlying pattern 32 of the underlying pattern area density $\alpha_{10}$ shown in FIG. 2. When the processing pattern 30 overlaps with the underlying pattern 32, as shown in FIG. 3, the underlying pattern area density $\alpha_{10}$ for the unit region is different from an underlying pattern area density under the processing pattern 30 actually exposed on the semiconductor substrate having the underlying pattern 32. Therefore, by use of the earlier correction equation using the underlying pattern area density $\alpha_{10}$, a sufficient correction accuracy cannot be achieved.

SUMMARY OF THE INVENTION

A first aspect of the present invention inheres in a method for correcting a proximity effect, and includes: classifying an underlying pattern of a level underlying a thin film layer; dividing a processing pattern to be transferred on the thin film layer into a first pattern overlapping with the underlying pattern and a second pattern which does not overlap with the underlying pattern according to the classified underlying pattern: calculating a pattern area density for the first and second patterns in a unit region; and calculating a corrected dose for the processing pattern according to the pattern area density.

A second aspect of the present invention inheres in an exposure method, and includes: preparing a substrate having a thin film layer deposited on a surface of an underlying layer, the underlying layer having an underlying pattern; coating a resist film on the thin film layer; obtaining a processing pattern configured to delineate on the resist film, and the underlying pattern; classifying the underlying pattern; dividing the processing pattern into a first pattern which overlaps with the underlying pattern and a second pattern which does not overlap with the underlying pattern, according to the classified underlying pattern; calculating a pattern area density for the first and second patterns in a unit region; calculating a corrected dose for the processing pattern based on the pattern area density; and exposing the resist film by the corrected dose.

A third aspect of the present invention inheres in a manufacturing method of a semiconductor device, and includes: forming an underlying pattern of an underlying layer on a semiconductor substrate; depositing a thin film layer in a surface of the underlying layer; coating a resist film on the thin film layer; loading the semiconductor substrate on a movable stage of an electron beam exposure apparatus; calculating a corrected dose by the steps of classifying the underlying pattern, dividing a processing pattern to be delineated on the resist film into an first pattern which overlaps with the underlying pattern and a second pattern which does not overlap with the underlying pattern according to the classified underlying pattern, calculating a pattern area density for the first and second patterns in a unit region, and calculating a corrected dose for the processing pattern based on the pattern area density; exposing the resist film by the corrected dose; developing the resist film; and processing the thin film layer by use of the developed resist film as a mask and transferring the processing pattern onto the thin film layer.

A fourth aspect of the present invention inheres in a proximity correction module, and includes: an area density calculation unit configured to classify an underlying pattern of an underlying layer, to divide a processing pattern to be delineated on a thin film layer formed in a surface of the underlying layer according to the classified underlying pattern into a pattern overlapping with the underlying pattern and a pattern not overlapping therewith and to calculate a pattern area density for each of the divided processing patterns in a unit region; an area density map memory configured to store a position of the unit region and the pattern area density of each of the divided processing patterns; and a dose correction calculation unit configured to calculate a corrected dose for the processing pattern based on the pattern area density.

BRIEF DESCRIPTION OF DRAWINGS

FIG. 7 is a view showing an example of a processing pattern in an overlap processing pattern extraction processing of the proximity correction method according to the first embodiment of the present invention;

FIG. 8 is a view showing an example of an underlying pattern in the overlap processing pattern extraction processing of the proximity correction method according to the first embodiment of the present invention;

FIG. 9 is a view showing an example of an overlap between the processing pattern and the underlying pattern in the overlap processing pattern extraction processing of the proximity correction method according to the first embodiment of the present invention;

FIG. 10 is a view showing an example of a first pattern in the overlap processing pattern extraction processing of the proximity correction method according to the first embodiment of the present invention;

FIG. 11 is a view showing an example of a second pattern in the overlap processing pattern extraction processing of the proximity correction method according to the first embodiment of the present invention;

FIG. 16 is a view showing an example of a processing pattern in the overlap processing pattern extraction processing of the proximity correction method according to the second embodiment of the present invention;

FIG. 17 is a view showing an example of a first underlying pattern in the overlap processing pattern extraction processing of the proximity correction method according to the second embodiment of the present invention;

FIG. 18 is a view showing an example of a second underlying pattern in the overlap processing pattern extraction processing of the proximity correction method according to the second embodiment of the present invention;

FIG. 19 is a view showing an example of an overlap between the processing pattern and the first and second underlying patterns in the overlap processing pattern extraction processing of the proximity correction method according to the second embodiment of the present invention;

FIG. 20 is a view showing an example of a first pattern in the overlap processing pattern extraction processing of the proximity correction method according to the second embodiment of the present invention;

FIG. 21 is a view showing an example of another first pattern in the overlap processing pattern extraction processing of the proximity correction method according to the second embodiment of the present invention;

FIG. 22 is a view showing an example of a second pattern in the overlap processing pattern extraction processing of the proximity correction method according to the second embodiment of the present invention;

DETAILED DESCRIPTION OF THE INVENTION

Figure 3:
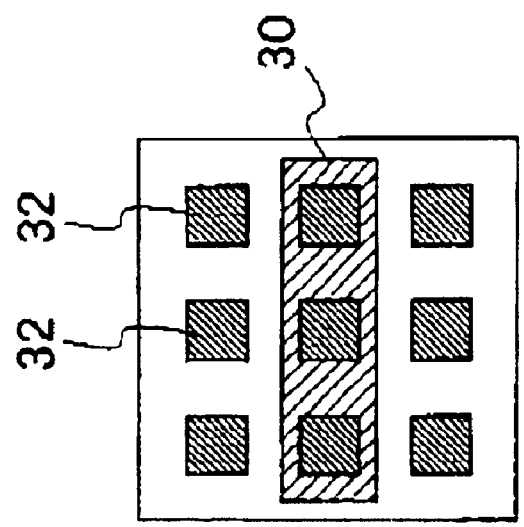
FIG. 3 is a view showing an overlap between a processing pattern and an underlying pattern of an earlier proximity correction method.
Figure 2:
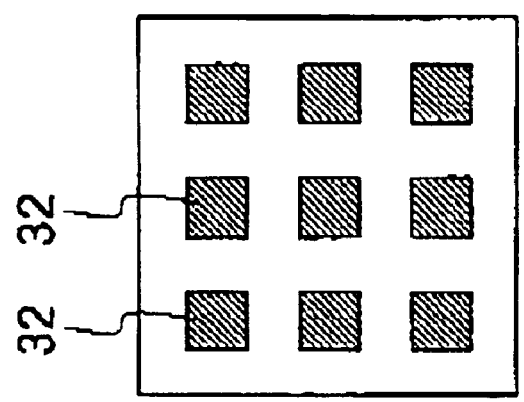
FIG. 2 is a view showing an example of an underlying pattern of the proximity correction method.
Figure 1:
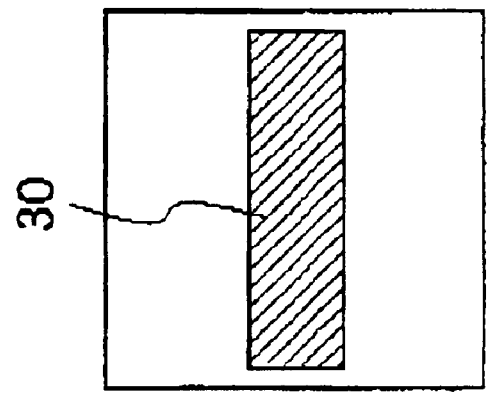
FIG. 1 is a view showing an example of a processing pattern of a proximity correction method.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 4:
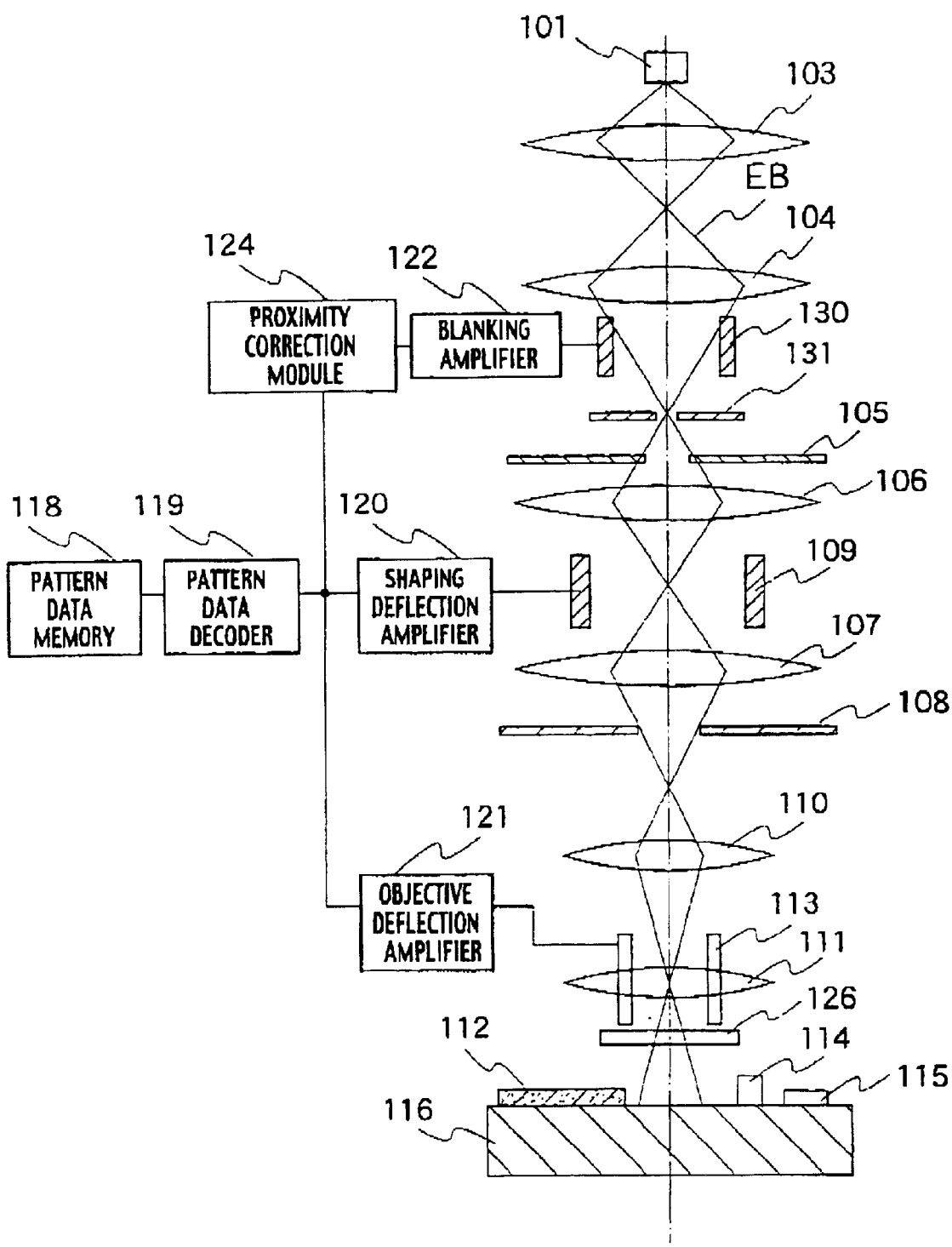
FIG. 4 is a schematic constitutional view of an electron beam exposure apparatus according to first and second embodiments of the present invention.

As shown in FIG. 4, an electron beam exposure apparatus according to a first embodiment of the present invention performs exposure while variably controlling a size of an electron beam EB by use of first and second shaping apertures 105 and 108. The electron beam EB radiated from an electron gun 101 is adjusted on its current density and Koehler illumination condition by first and second condenser lenses 103 and 104 and evenly illuminates the first shaping aperture 105. An image of this first shaping aperture 105 is formed on the second shaping aperture 108 by first and second projection lenses 106 and 107. In the second shaping aperture 108, a plurality of openings for shaping the electron beam EB are provided. In accordance with the size defined in processing pattern data, the electron beam EB irradiates to a position passing through a portion of the openings.

An irradiation position of the electron beam EB is controlled in such a manner that a shaping deflection system deflects the electron beam EB and thus the beam irradiation position on the second shaping aperture 108 is controlled. The shaping deflection system includes: a shaping deflector 109; a shaping deflection amplifier 120; and a pattern data decoder 119 for sending deflection data to the shaping deflection amplifier 120.

The electron beam EB passing through the second shaping aperture 108 is reduced and projected by a reducing lens 110 and an objective lens 111 and an image thereof is formed on a semiconductor substrate 112. Accordingly, the irradiation position of the electron beam EB is set on the semiconductor substrate 112 by an objective deflector 113. The objective deflector 113 is controlled by an objective deflection amplifier 121 for applying a voltage to the objective deflector 113 based on position data sent from the pattern data decoder 119.

The semiconductor substrate 112 is provided on a movable stage 116 together with a Faraday cup 114 and a marking table 115 for electron beam measurement. By moving the movable stage 116, the semiconductor substrate 112, the Faraday cup 114 or the marking table 115 can be selected.

In the case of moving the position of the electron beam EB on the semiconductor substrate 112, so as to avoid exposure of an unnecessary portion on the semiconductor substrate 112, the electron beam EB is deflected by a blanking electrode 130 and is cut by a blanking aperture 131. Thus, the electron beam ED is prevented from reaching the semiconductor substrate 112. A deflecting voltage applied to the blanking electrode 130 is controlled by the blanking amplifier 122 based on the position data sent from the pattern data decoder 119. Between the pattern data decoder 119 and the blanking amplifier 122, a proximity correction module 124 for correcting a proximity effect is provided. Delineating control data such as processing pattern data and underlying pattern data are stored in a pattern data memory 118.

Figure 5:
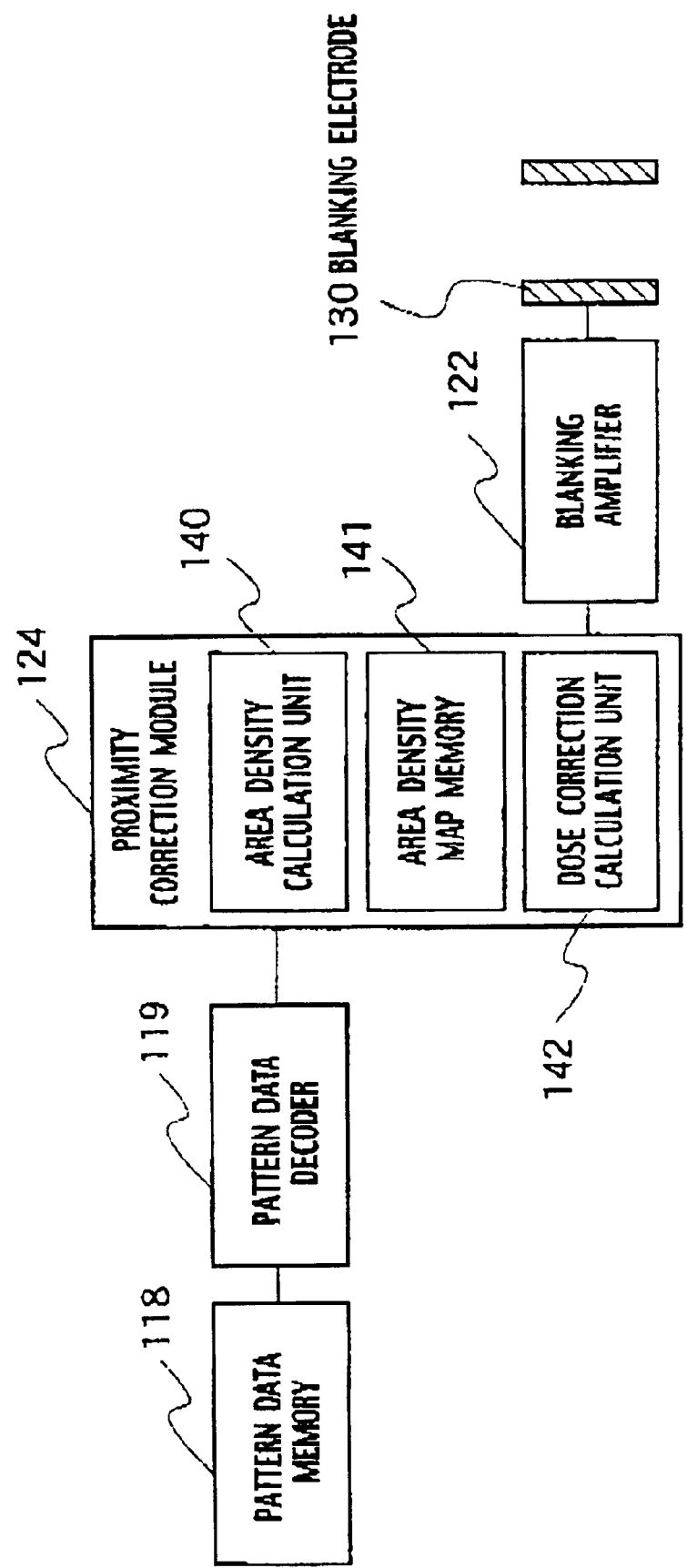
FIG. 5 is a block diagram of a proximity correction module according to the first and second embodiments of the present invention.
Figure 6:
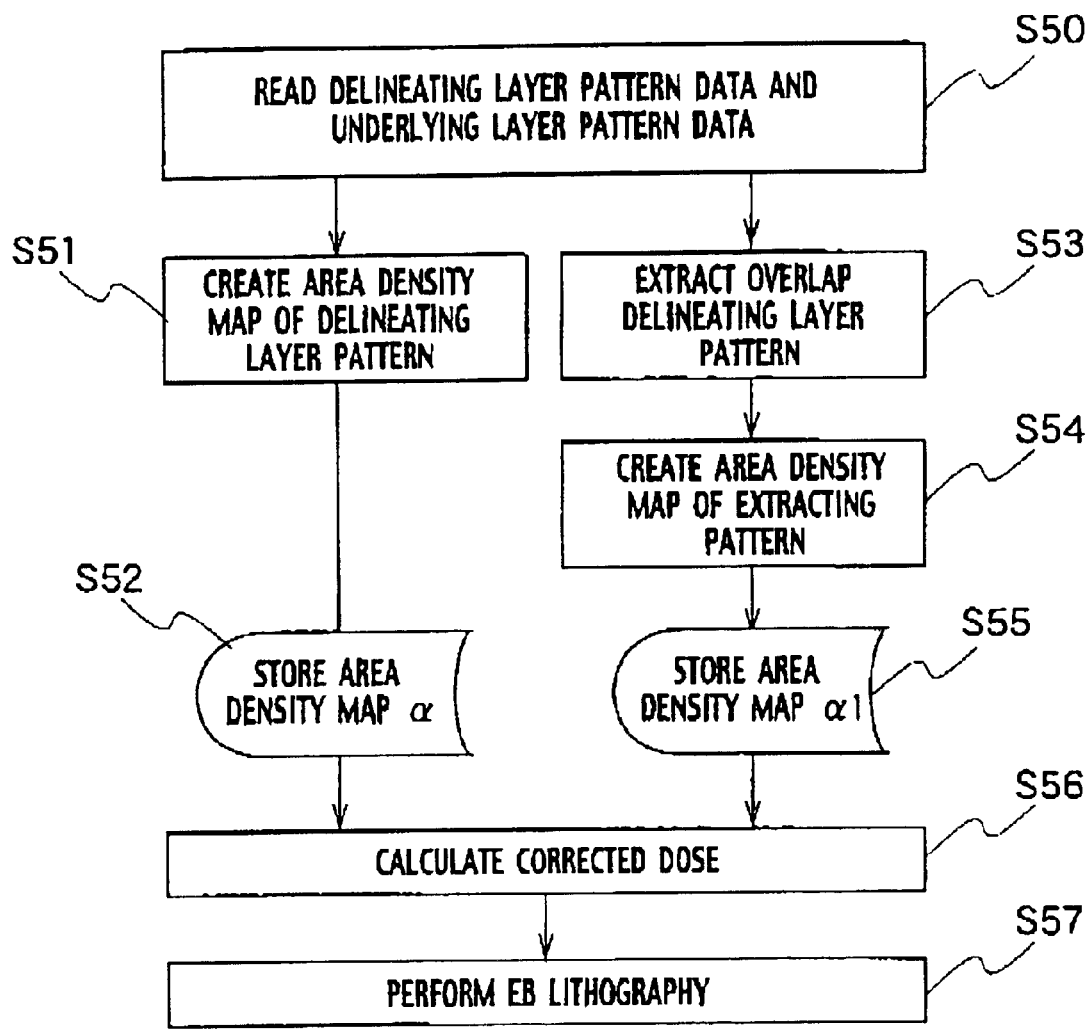
FIG. 6 is a flowchart used for explaining a proximity correction method according to the first embodiment of the present invention.

A proximity correction method according to the first embodiment of the present invention will be described by use of FIGS. 5 to 11. Herein, the case where an underlying pattern of a partially different material is formed in an exposure region is taken as an example. As shown in FIG. 5, the proximity correction module 124 includes an area density calculation unit 140, an area density map memory 141 and a dose correction calculation unit 142. The proximity correction method will be described below in accordance with a flowchart of FIG. 6.

(a) First, in Step S50, the pattern data decoder 119 reads stored processing pattern data and underlying pattern data from the pattern data memory 118 and outputs the data to the area density calculation unit 140 of the proximity correction module 124 by breaking the data down by a unit region into pattern dimensions and coordinates. For example, as shown in FIG. 7, a processing pattern 30 is positioned in the center of a unit region and is a rectangle long in a horizontal direction of the page. In addition, as shown in FIG. 8, underlying patterns 32a to 32i are squares disposed in a 3×3 lattice manner at equal intervals.

(b) In Step S51, the area density calculation unit 140 obtains a pattern area for each unit region from the pattern dimension and coordinates of the processing pattern 30, which are obtained from the pattern data decoder 119. Thus, the area density calculation unit 140 calculates and creates a pattern area density map of the processing pattern 30.

(c) In Step S52, the area density map memory 141 of the proximity correction module 124 obtains the pattern area density map of the processing pattern 30 by the unit region from the area density calculation unit 140 and stores the coordinates of the unit region as an index.

(d) Next, in Step S53, the area density calculation unit 140 extracts overlap processing patterns which overlap the underlying patterns 32a to 32i. As shown in FIG. 9, among the underlying patterns 32a to 32i, the processing pattern 30 overlaps the underlying patterns 32d to 32f. Thus, as shown in FIG. 10, the underlying patterns 32d to 32f are set as overlap processing patterns (first patterns) 33d to 33f. A region of the processing pattern 30, which does not overlap the underlying patterns 32d to 32f, is separated as a separate processing pattern (a second pattern) 31, as shown in FIG. 11.

(e) In Step S54, the area density calculation unit 140 obtains a pattern area of the extracted first patterns 33d to 33f from the pattern dimensions and the coordinates, and calculates a pattern area density of the first patterns 33d to 33f. The processing is performed in each unit region and thus pattern area density maps of the first patterns 33d to 33f and the second pattern 31, are created.

(f) In Step S55, the area density map memory 141 obtains the pattern area density map of the first patterns 33d to 33f and the second pattern 31 from the area density calculation unit 140, and stores the coordinates of the unit region as an index.

(g) In Step S56, the dose correction calculation unit 142 of the proximity correction module 124 reads the respective pattern area density maps of the first patterns 33d to 33f and the second pattern 31 from the area density map memory 141 by use of the coordinates of the unit region as the index, performs a correction calculation and thus calculates a corrected dose D. Thereafter, the dose correction calculation unit 142 calculates a corrected irradiation time based on the calculated corrected dose and outputs a blanking control signal.

(h) In Step S57, the blanking control signal outputted from the dose correction calculation unit 142 is subjected to digital-analog conversion (DAC) by the blanking amplifier 122 and is converted into a voltage applied to the blanking electrode 130. The electron beam EB is deflected by the voltage applied to the blanking electrode 130 and is cut by the blanking aperture 131. Thus, an irradiation time of the electron beam EB reaching the semiconductor substrate 112 is controlled. As a result, an exposure of the electron beam is controlled.

Note that the pattern area density map creation processing described in (a) to (f) may be performed prior to the delineating processing of the electron beam exposure.

In the proximity correction method according to the first embodiment of the present invention, in the underlying patterns 32a to 32i, the underlying patterns 32d to 32f which overlap the processing pattern 30 are extracted to be the first patterns 33d to 33f. The pattern area density $\alpha_1$ of the first patterns 33d to 33f is calculated and the corrected dose D is obtained by the following equation.

$$D = C / \{ \tfrac{1}{2} + \eta^*[\alpha + (\eta_1/\eta - 1)^*\alpha_1] \} \quad (5)$$

Here, $\alpha$ is a pattern area density of a processing pattern and C is a constant. Moreover, as to a ratio $\eta$ and $\eta_1$ of a backscattered energy of a substrate and of an underlying pattern material to an irradiation energy respectively, a value previously obtained empirically or by calculation for each underlying pattern is used.

As shown in FIGS. 10 and 11, the electron beam exposure is performed for the two kinds of processing patterns, which include: the first patterns 33d to 33f in which the underlying patterns 32d to 32f exist; and the second pattern 31 without the underlying pattern. The dose correction equation (5) is provided in consideration of a difference between these two kinds of processing patterns. Specifically, the dose correction equation (5) can be rewritten as below.

$$D/2 + \eta^*(\alpha - \alpha_1)^*D + \eta_1^*\alpha_1^*D = C \quad (6)$$

The first term in the left side of the equation (6) means that, when a proximity effect is not considered, a half of the irradiation energy is set to an exposure threshold C. In the second term in the left side, the pattern area density $\alpha_1$ of the first patterns 33d to 33f is subtracted from the pattern area density a of the processing pattern 30. In other words, the second term expresses the backscattered energy generated by subjecting the second pattern 31 to the electron beam exposure. The third term expresses the backscattered energy generated by subjecting the first patterns 33d to 33f to the electron beam exposure. Specifically, the dose correction equation (5) or (6) is an equation for obtaining the corrected dose D which sets the sum of the energies expressed in the first to the third terms in the equation (6) to a constant value, that is, the exposure threshold C. Therefore, in the case of delineating by use of the dose D corrected by the dose correction equation (5), energies accumulated in a resist can be kept constant without depending on the pattern area densities of the processing pattern and the underlying pattern. As a result, a desired resist size is obtained.

By extracting the underlying pattern directly below the processing pattern prior to the correction calculation, it is possible to provide the accurate correction calculation at a position irradiated by the electron beam EB with a difference in a structure of the underlying pattern. The extraction processing can be easily executed in a short time by a logical production "AND" processing and a logical subtraction "MASK" processing in the graphic logic operation. Moreover, in the correction calculation equation, the pattern area density $\alpha$ of the processing pattern and the pattern area density $\alpha_1$ of the first patterns are expressed by a linear connection. Consequently, the overlap of the backscattered energies can be accurately expressed and thus the proximity correction accuracy can be dramatically improved compared to the earlier case.

Note that more accurate proximity correction may be possible when, in Steps S51 and S54, the area density map is smoothed by use of a unit region determined by a backscattered distance $\beta_b$ value corresponding to each structure of the underlying pattern. For example, as the unit region, a half of the backscattered distance $\beta_b$ value or less is desirable. In the case of performing exposure at an accelerating voltage 50 kV, the backscattered distance $\beta_b$ of an Si substrate, a silicon oxide (SiO$_2$) film, an aluminum (Al) metal film or the like is about 10 $\mu$m and thus a unit region of 5 $\mu$m square or less may be suitable. On the other hand, the backscattered distance $\beta_b$ of a heavy metal film such as tungsten (W) is about 5 $\mu$m and thus a unit region of 2.5 $\mu$m square or less may be suitable.

Next, description will be given of a semiconductor device manufacturing process by the electron beam exposure using the proximity correction method according to the first embodiment of the present invention.

Figure 12:
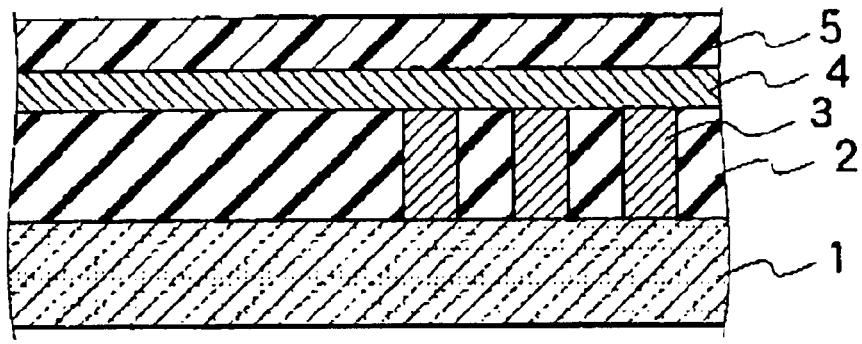
FIG. 12 is a view of a semiconductor device manufacturing process (No. 1) by use of an exposure method using the proximity correction method according to the first embodiment of the present invention.

(a) As shown in FIG. 12, on a surface of a semiconductor substrate 1, an interlayer insulating film 2 of a SiO$_2$ film as an underlying layer is deposited by a chemical vapor deposition (CVD) method. In a part of the interlayer insulating film 2, via holes are provided by a reactive ion etching (RIE) method and the like. In the via holes, plugs 3 made of W as underlying patterns are buried by a sputtering method and the like. After planarizing a surface of the interlayer insulating film 2 by chemical-mechanical polishing (CMP), a conducting film 4 made of Al is formed thereon by sputtering, vacuum deposition or the like. On a surface of the conducting film 4, a resist film 5 is coated using a spinner and the like. Then, the semiconductor substrate 1 is loaded on the movable stage 116 of the electron beam exposure apparatus.

Figure 13:
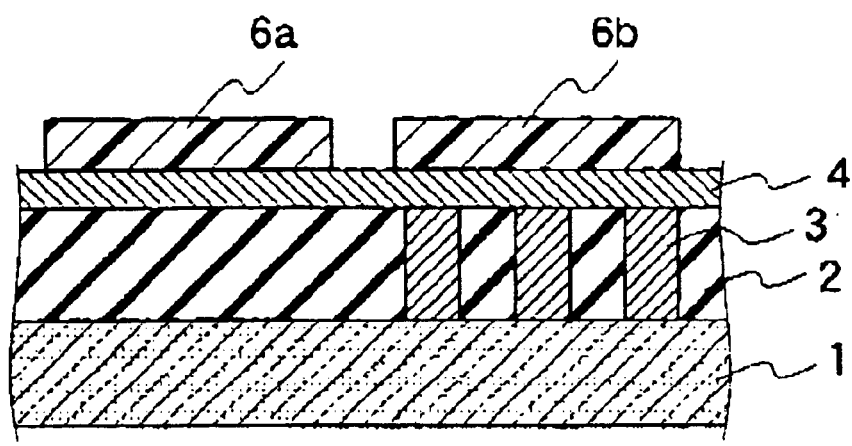
FIG. 13 is a view of a semiconductor device manufacturing process (No. 2) by use of the exposure method using the proximity correction method according to the first embodiment of the present invention.

(b) Based on the processing pattern data and underlying pattern data which are read by the pattern data decoder 119 from the pattern data memory 118, the proximity correction module 124 obtains the respective pattern area densities α and $α_1$. Here, the underlying pattern is the plug 3. Therefore, the unit region of the exposure area including the plugs 3, which is the first pattern, is 2.5 μm square and the unit region of the area not including the plug 3, which is the second pattern, is 5 μm square. Compared with the case of calculating the entire region as the unit region of a 2.5 μm square, computational complexity is reduced and thus throughput is improved. Moreover, as to the ratios η and $η_1$ of the backscattered energy to the irradiation energy, values of the Si substrate and W, which are empirically obtained for each underlying pattern in advance, are used. By the proximity correction using these values, the electron beam exposure is performed. Thereafter, by development processing, as shown in FIG. 13, first and second resist patterns 6a and 6b as processing patterns, are formed, respectively, in a region not including the plugs 3 and in a region including the plugs 3 in a lower part of the processing layer.

Figure 14:
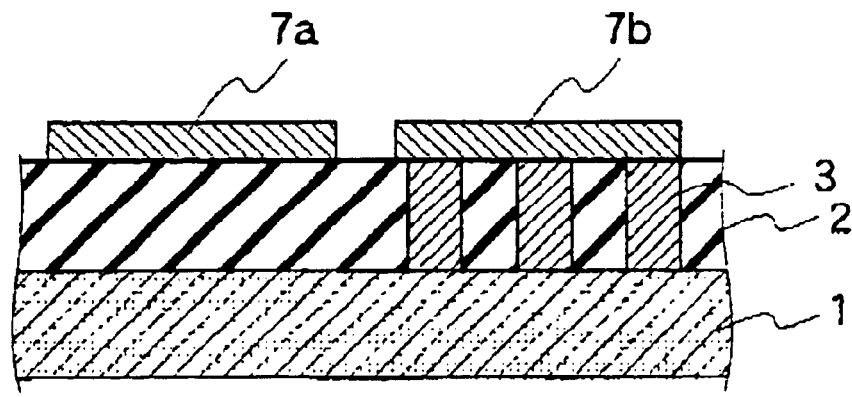
FIG. 14 is a view of a semiconductor device manufacturing process (No. 3) by use of the exposure method using the proximity correction method according to the first embodiment of the present invention.

(c) By using the first and second resist patterns 6a and 6b as a mask, selective etching of the conducting film 4 is performed by the RIE method and the like. Thus, as shown in FIG. 14, wiring layers 7a and 7b are formed.

As described above, according to the electron beam exposure method using the proximity correction method of the first embodiment of the present invention, the proximity correction can be performed in accordance with the underlying patterns of the processing pattern region. Thus, the resist pattern can be formed uniformly with good reproducibility.

Second Embodiment

A proximity correction method according to a second embodiment of the present invention is applied to the case where a processing pattern has first and second underlying patterns and is characterized in a proximity correction equation expressed by a linear connection between three kinds of pattern area densities. Points other than the above are similar to those of the first embodiment and thus repetitive description will be omitted.

The proximity correction method according to the second embodiment of the present invention will be described with reference to FIGS. 15 to 22.

Figure 15:
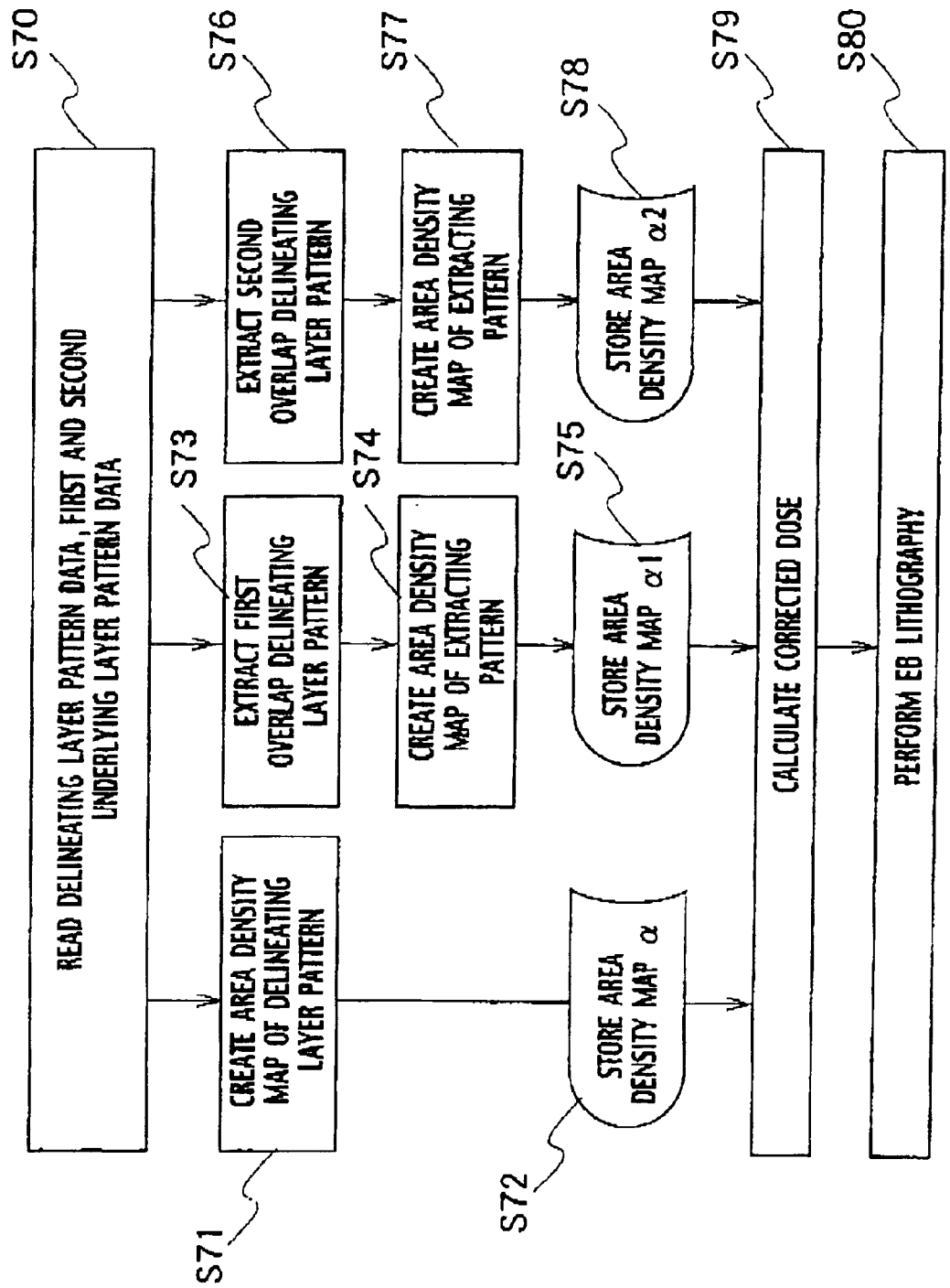
FIG. 15 is a flowchart used for explaining a proximity correction method according to a second embodiment of the present invention.

(a) First, in Step S70 of FIG. 15, the pattern data decoder 119 reads stored processing pattern data and first and second underlying pattern data from the pattern data memory 118 and outputs the data to the area density calculation unit 140 of the proximity correction module 124 by breaking the data down into pattern dimensions and coordinates by unit region. For example, as shown in FIG. 16, a processing pattern 40 is positioned in the center of a unit region and is a rectangle long in a horizontal direction of a page space. As shown in FIG. 17, the first underlying patterns 42a and 42b are squares and positioned in the center of a vertical direction of the page space, respectively, at left and right sides of a unit region. Moreover, as shown in FIG. 18, the second underlying patterns 44a and 44b are rectangles long in the vertical direction of the page space at left and right sides of a unit region.

(b) In Step S71, the area density calculation unit 140 obtains a pattern area for each unit region from the pattern dimension and coordinates of the processing pattern 40, which are obtained from the pattern data decoder 119. Thus, the area density calculation unit 140 calculates and creates a pattern area density map of the processing pattern 40. In Step S72, the area density map memory 141 of the proximity correction module 124 obtains a pattern area density of the processing pattern 40 from the area density calculation unit 140. Thereafter, the area density map memory 141 obtains the pattern area density map of the processing pattern 40 for each unit region and stores the coordinates of the unit region as an index.

(c) Next, in Step S73, as shown in FIG. 20, the area density calculation unit 140 extracts first overlap processing patterns (first patterns) 43a and 43b in which the processing pattern 40 and the first underlying patterns 42a and 42b overlap with each other. As shown in FIG. 19, th first underlying patterns 42a and 42b also overlap with the second underlying patterns 44a and 44b. In Step S74, the area density calculation unit 140 obtains a pattern area for each unit region from a pattern dimension and coordinates of the extracted first patterns 43a and 43b and calculates and creates a pattern area density map. In Step S75, the area density map memory 141 obtains the pattern area density map of the first patterns 43a and 43b for each unit region from the area density calculation unit 140 and stores the coordinates of the unit region as an index.

(d) Similarly, in Step S76, as shown in FIG. 21, the area density calculation unit 140 extracts second overlap processing patterns (another first patterns) 45a and 45b which are the overlapped area of the processing pattern 40 and the second underlying patterns 44a and 44b with each other from which regions of the first patterns 43a and 43b are removed. In Step S77, the area density calculation unit 140 obtains a pattern area for each unit region from a pattern dimension and coordinates of the extracted another first patterns 45a and 45b and calculates and creates a pattern area density map. In Step S78, the area density map memory 141 obtains a pattern area density of the another first patterns 45a and 45b from the area density calculation unit 140. The area density map memory 141 obtains the pattern area density map of the another first patterns 45a and 45b for each unit region and stores the coordinates of the unit region as an index. A region which overlaps with none of the first and second underlying patterns 42a, 42b, 44a and 44b is separated as a separate processing pattern (a second pattern) 41, as shown in FIG. 22.

( ) In Step S79, the dose correction calculation unit 142 reads the respective pattern, area density maps of the second pattern 41, the first patterns 43a and 43b and the another first patterns 45a and 45b from the area density map memory 141 by use of the coordinates of the unit region as the index, performs correction calculations thereof and thus calculates a corrected dose D. Thereafter, the dose correction calculation unit 142 calculates a corrected irradiation time from the calculated corrected dose and outputs a blanking control signal.

(f) In Step S80, the blanking control signal outputted from the dose correction calculation unit 142 is subjected to DAC by the blanking amplifier 122, and is converted into a voltage applied to the blanking electrode 130. The electron beam EB is deflected by the voltage applied to the blanking electrode 130 and is cut by the blanking aperture 131. Thus, an irradiation time of the electron beam EB reaching the semiconductor substrate 112 is controlled. As a result, an exposure of the electron beam is controlled.

In the proximity correction method according to the second embodiment of the present invention, respective pattern area densities $α_1$ and $α_2$ are calculated from the extracted first and another first patterns 43a, 43b, 45a and 45b and thus the corrected dose D is obtained by the following equation.

$$D = C / \{ 1/2 + \eta^* [\alpha + (\eta_1/\eta - 1)^* \alpha_1 + (\eta_2/\eta - 1)^* \alpha_2 ] \} \quad (7)$$

This dose correction equation (7) can be rewritten as below.

$$D/2 + \eta^*(\alpha - \alpha_1 - \alpha_2)^* D + \eta_1^* \alpha_1^* D + \eta_2^* \alpha_2 D = C \quad (8)$$

The first term in the left side of the equation (8) means that, when a proximity effect is not considered, a half of the irradiation energy is set to an exposure threshold C. In the second term in the left side, the pattern area density $\alpha_1$ of the first patterns 43a and 43b and the pattern area density $\alpha_2$ of the another first patterns 45a and 45b are subtracted from the pattern area density $\alpha$ of the processing pattern 40. In other words, the second term expresses the backscattered energy generated by subjecting the second pattern 41 caused by the exposure. The third term expresses the backscattered energy generated by subjecting the first patterns 43a and 43b caused by the exposure. The fourth term expresses the backscattered energy generated by subjecting the another first patterns 45a and 45b caused by the exposure. Specifically, the dose correction equation (7) is an equation for obtaining the corrected dose D which sets the sum of these energies to a constant value, that is, the exposure threshold C.

Therefore, in the case of delineating by use of the corrected dose D according to the proximity correction method of the second embodiment of the present invention, energies accumulated in a resist can be kept constant without depending on the pattern area densities of the processing pattern and the underlying patterns. As a result, a desired resist size is obtained. The pattern breaking processing can be easily executed in a short time by AND processing and MASK processing of the graphic logic operation. Moreover, in the correction calculation equation (7), the respective pattern area densities $\alpha$, $\alpha_1$ and $\alpha_2$ are expressed by a linear connection. Consequently, the overlap of the backscattered energies can be accurately expressed and thus the proximity correction accuracy can be dramatically improved compared to the earlier case.

Next, description will be given of a semiconductor device manufacturing process by the electron beam exposure using the proximity correction method according to the second embodiment of the present invention.

Figure 23:
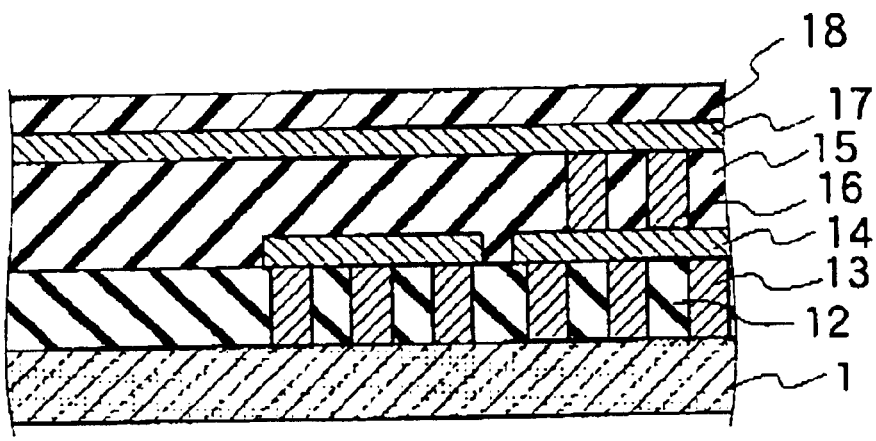
FIG. 23 is a view of a semiconductor device manufacturing process (No. 1) by use of an exposure method using the proximity correction method according to the second embodiment of the present invention.

(a) As shown in FIG. 23, on the semiconductor substrate 1, similarly to the manufacturing process shown in FIG. 12 through FIG. 14, on a surface of first plugs 13 and a first interlayer insulating film 12 in which the first plugs 13 are buried, a first wiring layer 14 is deposited. Then, a second interlayer insulating film 15 in which the second plugs 16 are buried, are formed on the first wiring layer 14. Furthermore, a conducting film 17 is formed on a surface of the second plugs 16 and the second interlayer insulating film 15. Thereafter, a resist film 18 is coated on a surface of the conducting film 17. Consequently, the semiconductor substrate 1 is loaded on the movable stage 116 of the electron beam exposure device. Here, as schematically shown in FIG. 23, there exist: an area which does not have any plugs as underlying patterns (left side); and an area which has first underlying patterns including the first plugs 13 and the first wiring layer 14 (center); an area which has second underlying patterns including the first and second plugs 13 and 16 and the first wiring layer 14 therebetween (right side). From FIG. 20 through FIG. 22 in sequence, the respective areas correspond to the second pattern, the first and another first patterns.

Figure 24:
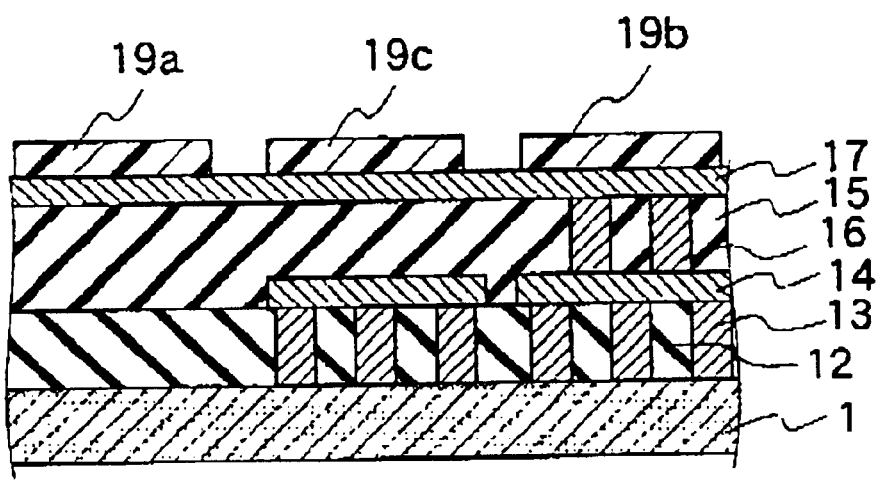
FIG. 24 is a view of a semiconductor device manufacturing process (No. 2) by use of the exposure method using the proximity correction method according to the second embodiment of the present invention.

(b) Next, based on the processing pattern data and underlying pattern data which are read by the pattern data decoder 119 from the pattern data memory 118, the proximity correction module 124 obtains the pattern area densities $\alpha$, $\alpha_1$ and $\alpha_2$ of the respective pattern regions. Here, the first and second underlying patterns include the first and second plugs 13 and 16 made of W and the like. Therefore, the unit region of the exposure region including the first and another first patterns is 2.5 $\mu$m square and the unit region of the second pattern is 5 $\mu$m square. Compared with the case of calculating the entire region as the unit region of 2.5 $\mu$m square, computational complexity is reduced and thus throughput is improved. Moreover, as to the respective ratios $\eta$, $\eta_1$ and $\eta_2$ of the backscattered energy to the irradiation energy corresponding to each area, values empirically obtained for each underlying pattern in advance are used. By the proximity correction using these values, electron beam exposure is performed. Thereafter, by development processing, as shown in FIG. 24, first, second and third resist patterns 19a, 19b and 19c as processing patterns are formed.

Figure 25:
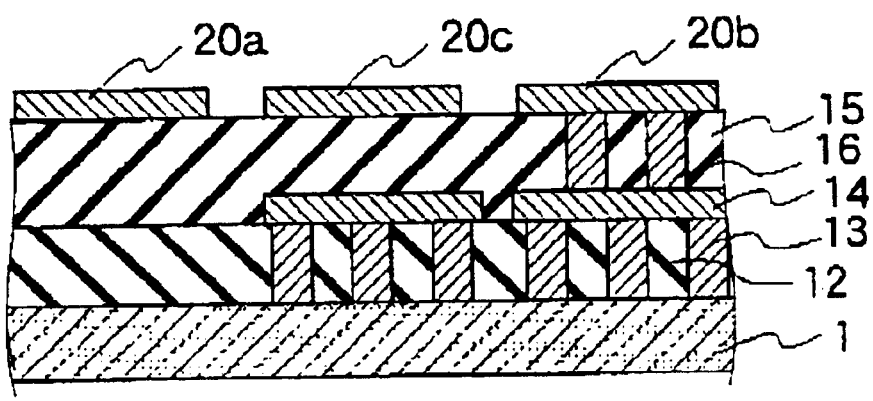
FIG. 25 is a view of a semiconductor device manufacturing process (No. 3) by use of the exposure method using the proximity correction method according to the second embodiment of the present invention.

(c) By using the first, second and third resist patterns 19a, 19b and 19c as a mask, selective etching of the conducting film 17 is performed by the RIE method and the like. Thus, as shown in FIG. 25, second wiring layers 20a to 20c are formed.

As described above, according to the electron beam exposure method using the proximity correction method of the second embodiment of the present invention, the proximity correction can be performed in accordance with the underlying patterns of the processing pattern areas. Thus, the resist pattern can be formed uniformly with good reproducibility.

Other Embodiments

In the first and second embodiments of the present invention, one or two kinds of structures are described as the underlying pattern. However, needless to say, even in the case of further including more kinds of the underlying patterns, the proximity correction method is applicable similarly by extracting a plurality of overlap processing patterns and calculating respective pattern area densities. A proximity correction equation in this case is obtained as below.

$$D = \frac{C}{\left\{ \frac{1}{2} + \eta \left[ \alpha + \sum_{k=1}^{n} \left( \frac{\eta_k}{\eta} - 1 \right) \alpha_k \right] \right\}} \quad (9)$$

Here, $\eta_k$ is a ratio of the backscattered energy to the irradiation energy with respect to the material of the k-th (k=1 to n) underlying pattern. In addition, $\alpha_k$ is a pattern area density of the k-th overlap processing pattern. Moreover, in the foregoing description, the underlying patterns include the plugs made of W. However, the backscattered distance $\beta_b$ is approximately in inverse proportion to an atomic mass of an underlying material. Thus, needless to say, the above-described proximity correction method is also applicable to the case of using a heavy metal such as a refractory metal or a compound thereof. Moreover, the backscattered distance $\beta_b$ changes when an underlying layer differs in a thickness, a depth of a position from the surface or the like. Thus, needless to say, even when such a structural parameter differs, the proximity correction according to the present invention is effective. Moreover, the extraction of the overlap processing patterns can be processed easily in a short time by use of a graphic logic operation processing of a computer-aided design (CAD) software. Moreover, even in the underlying patterns varying in materials, film thicknesses, positions of the inter layer or the like, when an energy distribution of backscattered electrons can be assumed as being the same, the plural underlying patterns are classified as the same structure. Thus, the extraction processing of the overlap processing patterns can be simplified and the time required for graphic processing can be shortened.

Various modifications will become possible for those skilled in the art after receiving the teachings of the present disclosure without departing from the scope thereof.

What is claimed is:

1. A method for correcting a proximity effect applied to a dose of an electron beam exposure, comprising:

classifying an underlying pattern of a level underlying a thin film layer;

dividing a processing pattern to be transferred on the thin film layer into a first pattern overlapping with the underlying pattern and a second pattern which does not overlap with the underlying pattern according to the classified underlying pattern;

calculating a pattern area density for the first and second patterns in a unit region; and calculating a corrected dose for the processing pattern according to the pattern area density.

2. The method of claim 1, wherein the processing pattern is exposed by the electron beam exposure.

3. The method of claim 1, wherein the processing pattern is divided by use of a graphic logic operation process.

4. The method of claim 2, wherein the corrected dose of a proximity effect of the electron beam exposure is expressed by a dose correction equation having a linear connection of the pattern area densities.

5. The method of claim 4, wherein the dose correction equation is expressed by use of a pattern area density of the processing pattern, a ratio of backscattered energy to irradiation energy of the electron beam exposure in an area without the underlying patterns, the pattern area density of the first pattern divided according to the k-th (k=1 to n) underlying patterns, and a ratio of backscattered energy to irradiation energy of the electron beam exposure according to the k-th underlying patterns.

6. The method of claim 5, wherein the dose correction equation is expressed as below $$D = \frac{C}{\left\{\frac{1}{2} + \eta\left[\alpha + \sum_{k=1}^{n}\left(\frac{\eta_k}{\eta} - 1\right)\alpha_k\right]\right\}}$$

where the corrected dose is D, the pattern area density of the processing pattern is $\alpha$, the ratio of backscattered energy to irradiation energy of the electron beam exposure in the region without the underlying patterns is $\eta$, the pattern area density of the first pattern divided according to the k-th (k=1 to n) underlying patterns is $\alpha_k$, the ratio of backscattered energy to irradiation energy of the electron beam exposure according to the k-th underlying patterns is $\eta_k$, and C is a constant.

7. The method of claim 4, wherein, the pattern area density for the k-th underlying patterns is calculated by use of a unit region corresponding to a length less than a backscattering distance of electrons irradiated by the electron beam exposure.

8. An exposure method, comprising:

preparing a substrate having a thin film layer deposited on a surface of an underlying layer, the underlying layer having an underlying pattern;

coating a resist film on the thin film layer;

obtaining a processing pattern configured to delineate on the resist film, and the underlying pattern;

classifying the underlying pattern;

dividing the processing pattern into a first pattern which overlaps with the underlying pattern and a second pattern which does not overlap with the underlying pattern, according to the classified underlying pattern;

calculating a pattern area density for the first and second patterns in a unit region;

calculating a corrected dose for the processing pattern based on the pattern area density; and exposing the resist film by the corrected dose.

9. The exposure method of claim 8, wherein the processing pattern is exposed by an electron beam exposure.

10. The exposure method of claim 8, wherein the processing pattern is divided by use of a graphic logic operation process.

11. The exposure method of claim 9, wherein the corrected dose of a proximity effect of the electron beam exposure is expressed by a dose correction equation having a linear connection of the pattern area densities.

12. The exposure method of claim 11, wherein the dose correction equation is expressed by use of a pattern area density of the processing pattern, a ratio of backscattered energy to irradiation energy of the electron beam exposure in an area without the underlying patterns, the pattern area density of the first pattern divided according to the k-th (k=1 to n) underlying patterns and a ratio of backscattered energy to irradiation energy of the electron beam exposure according to the k-th underlying patterns.

13. The exposure method of claim 12, wherein the dose correction equation is expressed as below $$D = \frac{C}{\left\{\frac{1}{2} + \eta\left[\alpha + \sum_{k=1}^{n}\left(\frac{\eta_k}{\eta} - 1\right)\alpha_k\right]\right\}}$$

where the corrected dose is D, the pattern area density of the processing pattern is $\alpha$, the ratio of backscattered energy to irradiation energy of the electron beam exposure in the region without the underlying patterns is $\eta$, the pattern area density of the first pattern divided according to the k-th (k=1 to n) underlying patterns is $\alpha_k$, the ratio of backscattered energy to irradiation energy of the electron beam exposure according to the k-th underlying patterns is $\eta_k$, and C is a constant.

14. The exposure method of claim 9, wherein the pattern area density for the k-th underlying patterns is calculated by use of a unit region corresponding to a length less than a backscattering distance of electrons irradiated by the electron beam exposure.

15. A manufacturing method of a semiconductor device, comprising:

forming an underlying pattern of an underlying layer on a semiconductor substrate;

depositing a thin film layer in a surface of the underlying layer;

coating a resist film on the thin film layer;

loading the semiconductor substrate on a movable stage of an electron beam exposure apparatus;

calculating a corrected dose by the steps of classifying the underlying pattern, dividing a processing pattern to be delineated on the resist film into an first pattern which overlaps with the underlying pattern and a second pattern which does not overlap with the underlying pattern according to the classified underlying pattern, calculating a pattern area density for the first and second patterns in a unit region, and calculating a corrected dose for the processing pattern based on the pattern area density;

exposing the resist film by the corrected dose;

developing the resist film; and processing the thin film layer by use of the developed resist film as a mask and transferring the processing pattern onto the thin film layer.

16. The manufacturing method of claim 15, wherein the processing pattern is exposed by an electron beam exposure.

17. The manufacturing method of claim 15, wherein the processing pattern is divided by use of a graphic logic operation process.

18. The manufacturing method of claim 16, wherein the corrected dose of a proximity effect of the electron beam exposure is expressed by a dose correction equation having a linear connection of the pattern area densities.

19. The manufacturing method of claim 18, wherein the dose correction equation is expressed by use of a pattern area density of the processing pattern, a ratio of backscattered energy to irradiation energy of the electron beam exposure in an area without the underlying patterns, the pattern area density of the first pattern divided according to the k-th (k=1 to n) underlying patterns and a ratio of backscattered energy to irradiation energy of the electron beam exposure according to the k-th underlying patterns.

20. The manufacturing method of claim 19, wherein the dose correction equation is expressed as below $$D = \frac{C}{\left\{\frac{1}{2} + \eta\left[\alpha + \sum_{k=1}^{n}\left(\frac{\eta_k}{\eta} - 1\right)\alpha_k\right]\right\}}$$

where the corrected dose is D, the pattern area density of the processing pattern is $\alpha$, the ratio of backscattered energy to irradiation energy of the electron beam exposure in the region without the underlying patterns is $\eta$, the pattern area density of the first pattern divided according to the k-th (k=1 to n) underlying patterns is $\alpha_k$, the ratio of backscattered energy to irradiation energy of the electron beam exposure according to the k-th underlying patterns is $\eta_k$, and C is a constant.

21. The manufacturing method of claim 16, wherein the pattern area density for the k-th underlying patterns is calculated by use of a unit region corresponding to a length less than a backscattering distance of electrons irradiated by the electron beam exposure.

22. A proximity correction module, comprising:

an area density calculation unit configured to classify an underlying pattern of an underlying layer, to divide a processing pattern to be delineated on a thin film layer formed in a surface of the underlying layer according to the classified underlying pattern into a pattern overlapping with the underlying pattern and a pattern not overlapping therewith and to calculate a pattern area density for each of the divided processing patterns in a unit region;

an area density map memory configured to store a position of the unit region and the pattern area density of each of the divided processing patterns; and a dose correction calculation unit configured to calculate a corrected dose for the processing pattern based on the pattern area density.

* * * * *